(12) United States Patent
Ohtani

(10) Patent No.: US 8,878,261 B2
(45) Date of Patent: Nov. 4, 2014

(54) SEMICONDUCTOR DEVICE AND METHOD OF MANUFACTURING THE SAME

(71) Applicant: Canon Kabushiki Kaisha, Tokyo (JP)

(72) Inventor: Akira Ohtani, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/889,623

(22) Filed: May 8, 2013

(65) Prior Publication Data

US 2013/0321660 A1 Dec. 5, 2013

(30) Foreign Application Priority Data

May 29, 2012 (JP) ................................ 2012-122395

(51) Int. Cl.

| H01L 29/76 | (2006.01) |
| H01L 29/06 | (2006.01) |
| H01L 29/78 | (2006.01) |
| H01L 21/265 | (2006.01) |
| H01L 29/66 | (2006.01) |
| H01L 21/266 | (2006.01) |

(52) U.S. Cl.
CPC ........ H01L 29/0688 (2013.01); H01L 29/7834 (2013.01); H01L 21/26586 (2013.01); H01L 29/66659 (2013.01); H01L 21/266 (2013.01)
USPC ..... 257/288; 257/350; 257/401; 257/E51.005

(58) Field of Classification Search
USPC ............................ 257/288, 350, 401, E51.005
See application file for complete search history.

(56) References Cited

U.S. PATENT DOCUMENTS

| 8,053,272 B2 | 11/2011 | Ohtani et al. ................... 438/98 |
| 8,482,646 B2 | 7/2013 | Watanabe et al. ............. 348/308 |
| 8,501,520 B2 | 8/2013 | Hirota et al. .................... 438/72 |
| 2010/0013007 A1* | 1/2010 | Miyakoshi .................... 257/329 |

FOREIGN PATENT DOCUMENTS

| JP | H04-068574 | 3/1992 |
| JP | H06-029522 | 2/1994 |
| JP | H07-122733 | 5/1995 |
| JP | H07-213423 | 11/1995 |
| JP | H07-312423 | 11/1995 |
| JP | 2007-049039 | 2/2007 |
| JP | 2010-010459 | 1/2010 |
| JP | 2011-066055 | 3/2011 |
| JP | 2011-097080 | 5/2011 |

* cited by examiner

*Primary Examiner* — Timor Karimy

(74) *Attorney, Agent, or Firm* — Fitzpatrick, Cella, Harper & Scinto

(57) ABSTRACT

A semiconductor device comprising a MOS transistor provided in a semiconductor region, wherein a source region and a drain region of the MOS transistor have a first conductivity type, the source region includes a first region including an upper portion of a boundary portion between the source region and a channel region of the MOS transistor, and a second region including an lower portion of the boundary portion, and the first region contains an impurity having a second conductivity type different from the first conductivity type, in an amount larger than that in the second region.

9 Claims, 5 Drawing Sheets

F I G. 5A
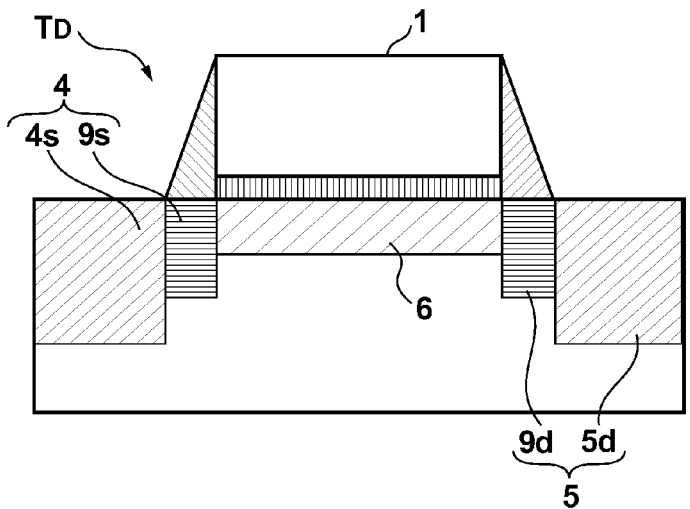
F I G. 5B
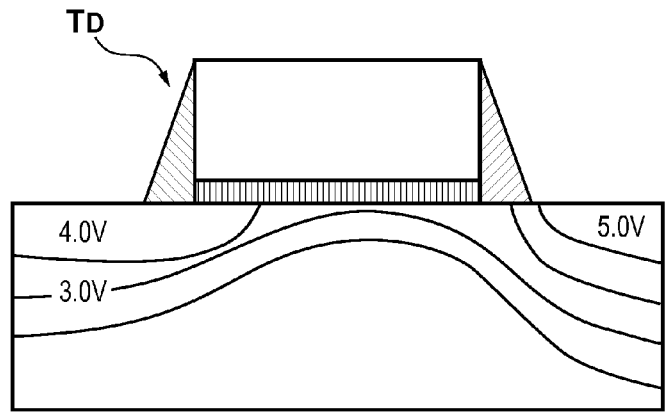
F I G. 5C
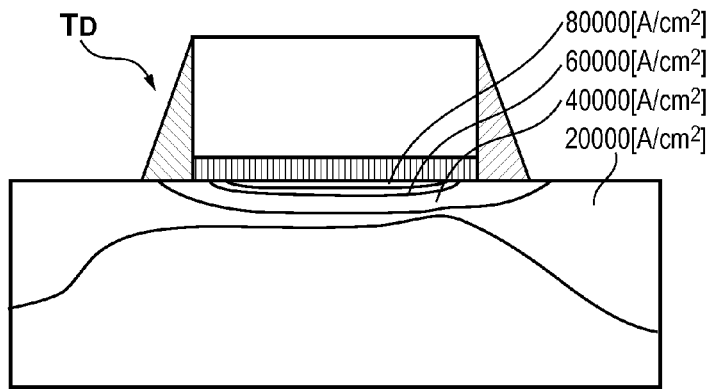

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

An interface trap produced by defects existing in the interface between a semiconductor and insulating film forming a MOS device has an influence on the electric character of the MOS device. For example, the interface trap can generate noise in the operation of a MOS transistor in a source follower circuit.

For example, Japanese Patent Laid-Open No. 7-122733 has disclosed a buried channel type MOS transistor having a channel formed in a position deeper than a p-type impurity region 8 formed in the surface portion of a semiconductor region. According to patent literature 1, this structure reduces the influence of noise caused by the interface trap.

SUMMARY OF THE INVENTION

One of the aspects of the present invention provides a semiconductor device comprising a MOS transistor provided in a semiconductor region, wherein a source region and a drain region of the MOS transistor have a first conductivity type, the source region includes a first region including an upper portion of a boundary portion between the source region and a channel region of the MOS transistor, and a second region including an lower portion of the boundary portion, and the first region contains an impurity having a second conductivity type different from the first conductivity type, in an amount larger than that in the second region.

Further features of the present invention will become apparent from the following description of exemplary embodiments with reference to the attached drawings.

BRIEF DESCRIPTION OF THE DRAWINGS

FIGS. 5A, 5B, and 5C are views for respectively explaining the structure, potential distribution, and current density distribution of a comparative example;

DESCRIPTION OF THE EMBODIMENTS

Figure 1A:
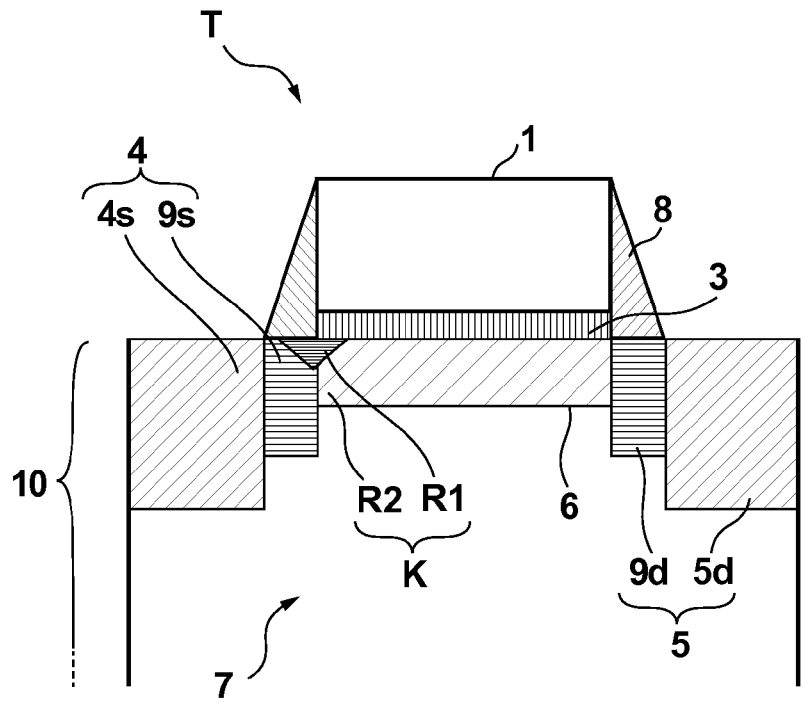
FIGS. 1A and 1B are views for explaining a configuration example of an embodiment.
Figure 1B:
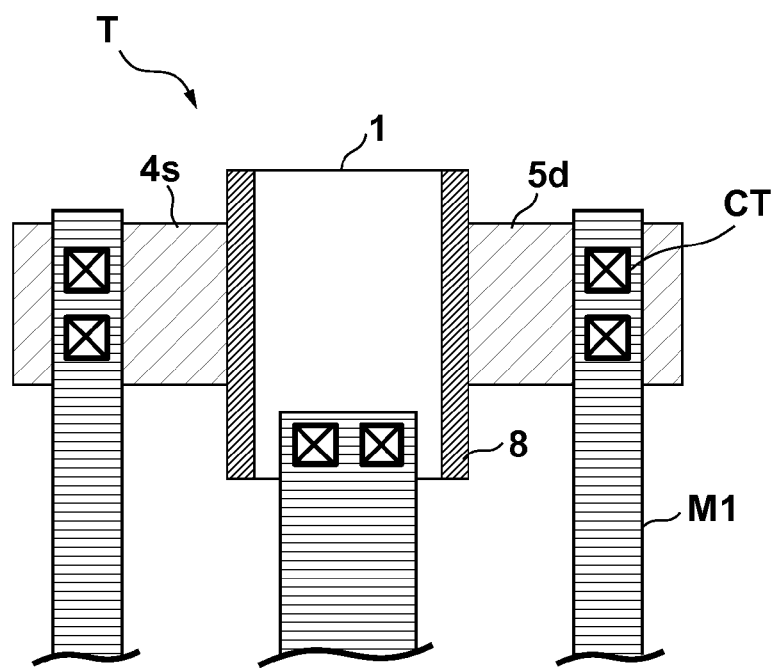

A semiconductor device and a method of manufacturing the same according to an embodiment will be explained below with reference to FIGS. 1A to 6. FIG. 1A schematically shows the structure of a MOS transistor T of the semiconductor device of this embodiment. Each of a source region 4 and a drain region 5 of the MOS transistor T has a first conductivity type (e.g., an n-type). Also, the MOS transistor T can include a first region R1 including an upper portion of a boundary portion K between a channel region 6 and the source region 4, and a second region R2 including an lower portion of the boundary portion K. The first region R1 can contain an impurity for forming a semiconductor region having a second conductivity type (p-type) different from the first conductivity type (n-type), in an amount larger than that in the second region R2. In the following description, an impurity for forming a p-type semiconductor region will simply be referred to as "a p-type impurity", and an impurity for forming an n-type semiconductor region will simply be referred to as "an n-type impurity". FIG. 1B schematically shows a layout example when the MOS transistor T is viewed from its upper surface. The MOS transistor T can electrically be connected via, for example, a first metal layer M1 and contacts CT. Of the first and second regions R1 and R2, the first region R1 is positioned on the surface side of a semiconductor substrate. The first and second regions R1 and R2 can exist on a normal with respect to the surface of the semiconductor substrate in the boundary portion K. The surface (major surface) of the semiconductor substrate includes, for example, the interface between the semiconductor substrate and an insulating film 3 as a gate insulating film. The boundary portion K can also be defined by the end face of the source or drain region of a gate electrode. Note that in the following explanation, "above" means the direction from the interior to the surface of the semiconductor substrate.

Assuming that the MOS transistor T is an re-channel transistor (NMOS transistor), a method of manufacturing the MOS transistor T will be described below with reference to FIGS. 1A, 1B, and 2. The MOS transistor T is obtained by using known semiconductor manufacturing processes such as oxidation, deposition, etching, and ion implantation, and can be formed by, for example, the following procedures. First, after an element isolation 11 and a well region (not shown) are formed in a substrate semiconductor 10 (to be referred to as 'substrate' hereinafter) including a p-type semiconductor region 7, an insulating film 3 is formed on the substrate 10, and a gate electrode 1 is formed on the insulating film 3. Then, an n-type impurity is implanted into prospective source and drain portions of the substrate 10. In this implantation, diffusion layers $9s$ and $9d$ can be formed by self-alignment with respect to the gate electrode 1. This implantation can be performed by ion-implanting, for example, phosphorous at an acceleration voltage of 75 [keV] and a dose of $2.5 \times 10^{14}$ [cm$^{-2}$]. The insulating film 3 is a film containing silicon oxide, but may also be a film containing silicon nitride.

After the insulating film 3 is formed, it is also possible to implant an impurity into the substrate 10 (for example, ion-implant arsenic at an acceleration voltage of 50 [keV] and a dose of $2 \times 10^{12}$ [cm$^{-2}$]), in order to adjust the threshold voltage of the MOS transistor T. Consequently, it is possible to give, for example, the n-conductivity type to a region (channel region 6) between the diffusion regions $9s$ and $9d$, thereby forming a depletion type MOS transistor as the MOS transistor T. Thus, the diffusion layers $9s$ and $9d$ having the first conductivity type (n-type) are formed in the substrate 10, and the gate electrode 1 is formed on the channel region 6.

Figure 2:
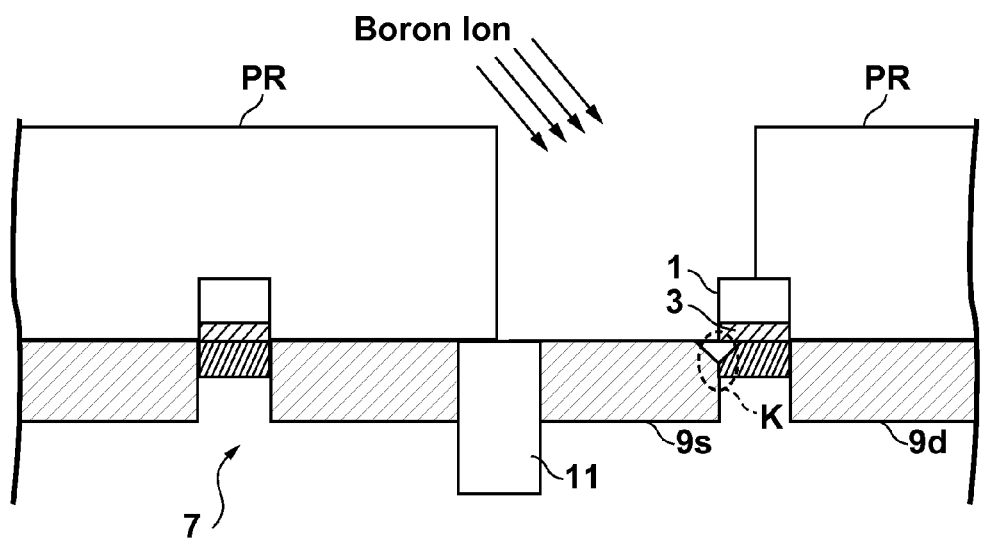
FIG. 2 is a view for explaining a part of an example of a manufacturing method of the embodiment.

Then, as shown in FIG. 2, a resist pattern RP having an opening above at least the diffusion layer $9s$ (a prospective portion of the source region 4) of the diffusion layers $9s$ and $9d$ can be formed on the substrate 10. After that, a p-type impurity can be implanted through the opening into a portion where a first region R1 is to be formed. This implantation can be performed by ion-implanting, for example, boron at an acceleration voltage of 5 [keV], a dose of $3 \times 10^{12}$ [cm$^{-2}$], and an implantation angle of 45°. This implantation angle can be determined in accordance with the height of the resist pattern RP. The implantation angle can also be determined in accordance with, for example, the position of the resist pattern RP or the width of the opening. In the second step as described above, it is possible to form a first region R1 at an upper portion of a boundary portion K between the channel region 6 and diffusion layer 9s, and a second region R2 at a lower portion of the boundary portion K. The concentration of the p-type impurity in the first region R1 is higher than that in the second region R2. That is, the net concentration of the n-type impurity in the first region R1 is lower than that in the second region R2. Note that the conductivity type of the first region R1 can be either the n-type or p-type. The second region R2 preferably has the n-type in order for the MOS transistor to operate well.

After that, side spacers 8 are formed on the two sides of the gate electrode 1. In addition, diffusion layers 4s and 5d can be formed by implanting an n-type impurity into prospective source and drain portions. The side spacers 8 can be formed by using silicon oxide or silicon nitride. This implantation can be performed by ion-implanting, for example, arsenic at an acceleration voltage of 65 [keV] and a dose of $4\times10^{15}$ [cm$^{-2}$]. The source region 4 of the MOS transistor T includes the diffusion layers 4s and 9s, and the drain region 5 of the MOS transistor T includes the diffusion layers 5d and 9d. Thus, the MOS transistor T having an LDD (Lightly Doped Drain) structure can be formed. After that, an interlayer dielectric film, contacts, metal layers, vias for connecting the metal layers, and the like (none of them are shown) can be formed as needed.

Note that this formation method is an example, and it is also possible to, for example, form the diffusion layers 9s and 9d after the first and second regions R1 and R2 are formed. The first and second regions R1 and R2 can also be formed after the diffusion layers 4s and 5d are formed. In this case, the acceleration voltage need only be increased because the side spacers 8 exist.

As described previously, the first region R1 can contain the p-type impurity in an amount larger than that in the second region R2. On the side of the source region 4, carriers reach the channel region 6 by going around an energy potential barrier formed in the first region R1. That is, in the boundary portion K, the carriers diffuse in the second region R2 more easily than in the first region R1. This reduces carriers to be trapped by the interface state in the first region R1. Also, carriers having gone over the energy potential barrier can drift toward the drain region 5 in accordance with the electric field of a depletion layer formed by the application of a bias to the drain region 5. Accordingly, the influence of the interface trap on the carriers in the channel region 6 is larger on the side of the source region 4 than on the side of the drain region 5. Therefore, although the first and second regions R1 and R2 are not formed on the drain side in this embodiment, they may also be formed on the drain side. In this embodiment, an electric current flowing through the channel region 6 flows by avoiding the trap of the interface state in the boundary portion K. This can reduce the influence of noise caused by the trap in the interface state of the MOS transistor T.

Figure 3:
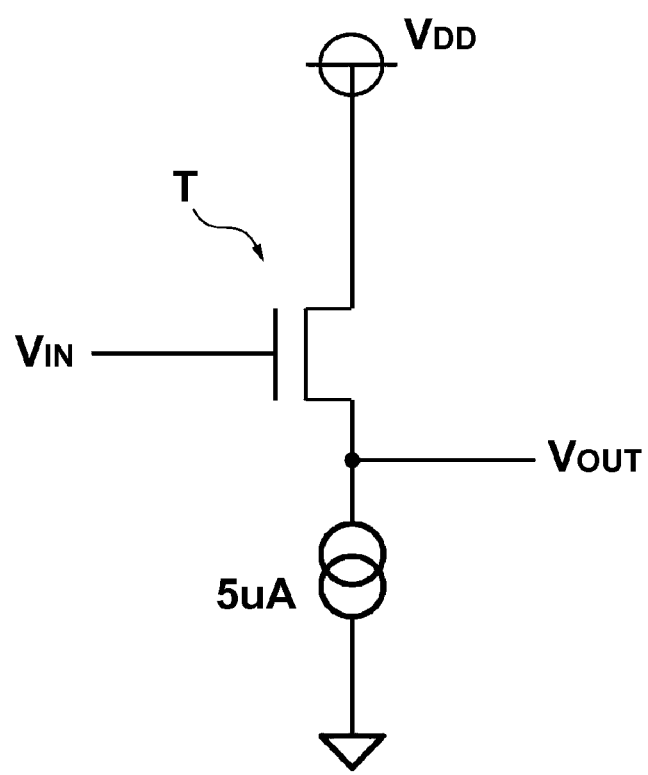
FIG. 3 is a view for explaining an example of a circuit used in the embodiment.
Figure 4A:
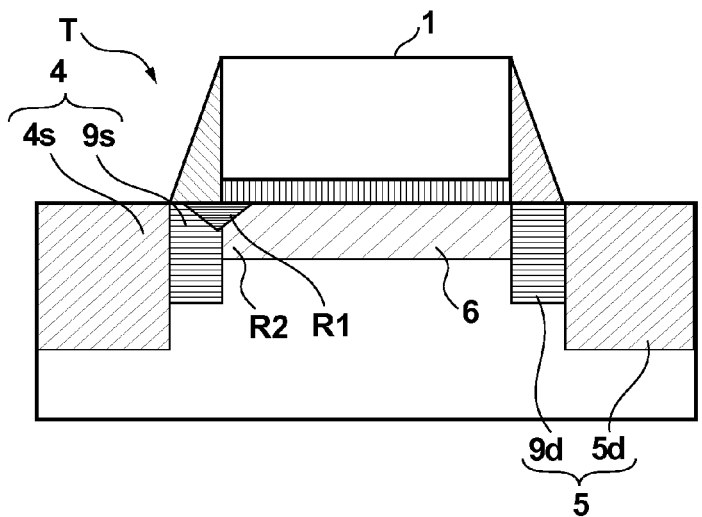
FIGS. 4A, 4B, and 4C are views for respectively explaining the structure, potential distribution, and current density distribution of the embodiment.
Figure 4B:
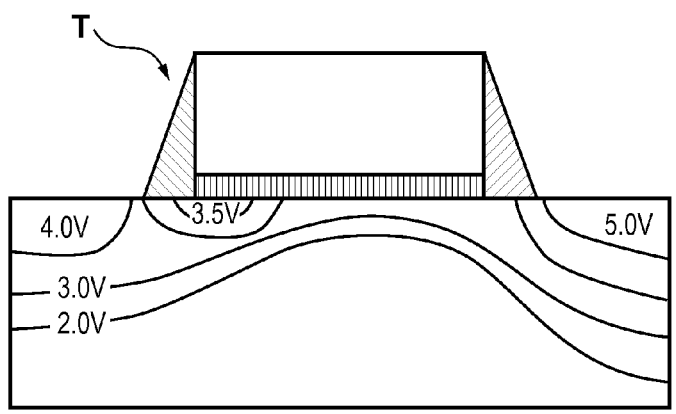
Figure 4C:
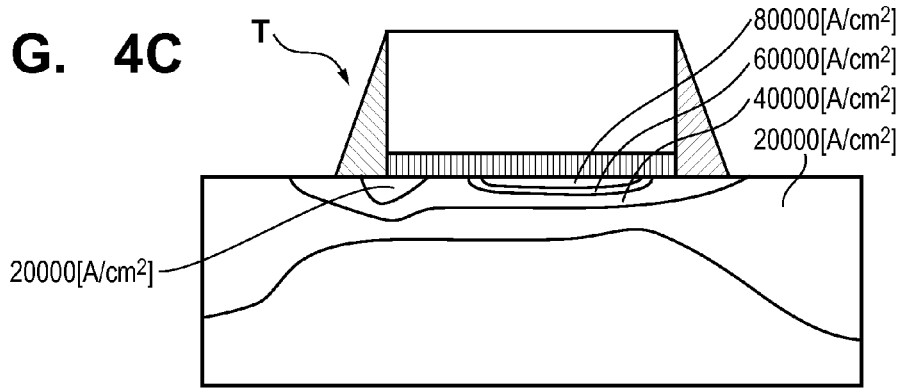

As shown in FIG. 3, the MOS transistor T can be used to, for example, form a part of a source follower circuit. FIG. 4A shows the structure of the MOS transistor T. FIG. 4B shows the potential distribution of the MOS transistor T. The potential of the gate electrode 1 is 4.8 V, that of the drain region 5 is 5.0 V, and that of the semiconductor region 7 is 0.0 V. Also, a constant current source (5 μA) is connected to the source region 4, and the potential of the source region 4 is 4.0 V. FIG. 4C shows the current density distribution of the MOS transistor T under the above-described conditions. As indicated by the current density distribution shown in FIG. 4C, an electric current flowing through the channel region 6 of the MOS transistor T flows by avoiding the interface trap in the boundary portion K.

As a comparative example, a MOS transistor $T_D$ as shown in FIG. 5A will be described below. The second step is not performed on the MOS transistor $T_D$. FIG. 5B shows the potential distribution of the MOS transistor $T_D$ like FIG. 4B. FIG. 5C shows the current density distribution of the MOS transistor $T_D$ like FIG. 4C. As indicated by the current density distribution shown in FIG. 5C, an electric current flowing through a channel region 6 of the MOS transistor $T_D$ does not avoid any interface trap in a boundary portion K.

Figure 6:
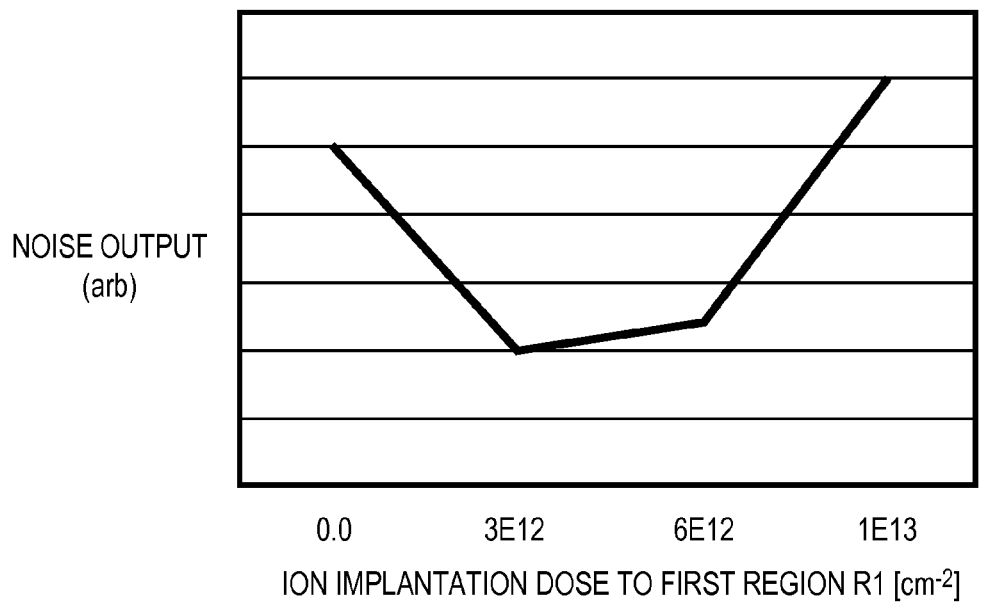
FIG. 6 is a view for explaining the effect of the embodiment.

FIG. 6 shows the result of noise measurement when the MOS transistor T performs a source follower operation by the system shown in FIG. 3, by plotting the dose of impurity implantation in the second step on the abscissa, and the noise output value on the ordinate. As shown in FIG. 6, when the dose is $6\times10^{12}$ [cm$^{-2}$] or more, the noise output value increases. When the concentration of the p-type impurity in the first region R1 increases, the energy potential barrier in the second region R2 increases accordingly, that is, the threshold voltage of the MOS transistor T increases. This makes it harder for carriers to diffuse not only in the first region R1 but also in the second region R2. Accordingly, the first region R1 is preferably formed so as to form an energy potential distribution in which carriers can avoid the interface trap in the boundary portion K and diffuse to the region where they drift toward the drain region 5 by the electric field from the drain region 5. For example, the carriers need only diffuse to the vicinity of the center of the channel region while avoiding the interface trap in the boundary portion K, and the first region R1 can be formed to have a depth smaller than the half of a channel length L of the MOS transistor T. As described above, this embodiment can reduce the influence of noise caused by the interface trap on the electric character of the MOS transistor T.

The present invention is not limited to the above embodiment, and it is of course possible to appropriately change the object, state, application, function, and other specifications, and carry out the invention by another embodiment. For example, the MOS transistor T is an NMOS transistor in the above embodiment, but the present invention is similarly applicable to a PMOS transistor. Also, the MOS transistor T is a depletion type transistor (the channel region 6 is n-type) in the above embodiment, but the present invention is similarly applicable to an enhancement type transistor (the channel region 6 is p-type). In this case, the net concentration of the p-type impurity in the first region R1 is higher than that in the second region R2.

Figure 7:
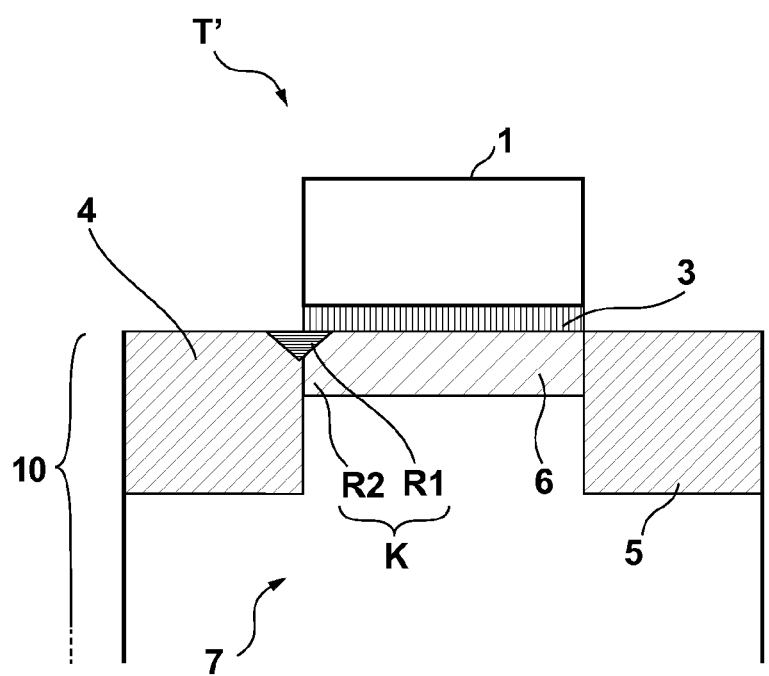
FIG. 7 is a view for explaining another example of the arrangement of the embodiment.

In addition, the same effect as described can be obtained by using a MOS transistor T' using no LDD structure as shown in FIG. 7 instead of the MOS transistor T, in order to reduce a leakage current or diffusion layer junction capacitance. In this case, the source region 4 and drain region 5 can be formed such that the concentration of the n-type impurity in these regions is equal to or higher than the concentration of the p-type impurity in the semiconductor region 7 and $1\times10^{18}$ [cm$^{-3}$] or less.

Furthermore, the above-described semiconductor device can be used in a solid-state image sensor included in a camera. The concept of a camera includes not only an apparatus whose main purpose is photographing, but also an apparatus (for example, a personal computer or cell phone) secondarily including a photographing function. A camera can include a solid-state image sensor, and a processing unit for processing signals output from the solid-state image sensor. This processing unit can include an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-122395, filed May 29, 2012, which is hereby incorporated by reference herein in its entirety.

What is claimed is:

1. A semiconductor device comprising
   a MOS transistor including a gate electrode, a source region and a drain region, wherein
   said source region and said drain region have a first conductivity type,
   said gate electrode is arranged above a channel region between said source region and said drain region,
   said source region includes a first region including an upper portion of a boundary portion between said source region and said channel region, and a second region including an lower portion of said boundary portion, and
   said first region contains an impurity having a second conductivity type different from said first conductivity type, in an amount larger than that in said second region.

2. The device according to claim 1, wherein said MOS transistor comprises a part of a source follower circuit.

3. The device according to claim 2, further comprising a current source electrically connected to said source region of said MOS transistor.

4. The device according to claim 1, wherein said first region has a depth that is smaller than half of a channel length of said MOS transistor.

5. The device according to claim 1,
   wherein a concentration of an impurity for forming said first conductivity type in said source region and said drain region is higher than that of an impurity for forming said second conductivity type in said semiconductor region, and
   wherein the concentration of said impurity for forming said first conductivity type in the source region is not more than $1 \times 10^{18}$ cm$^{-3}$.

6. A camera comprising:
   a semiconductor device according to claim 1; and
   a processing unit configured to process a signal output from said semiconductor device.

7. The device according to claim 1, wherein
   said source region further includes
      a first diffusion layer and
      a second diffusion layer having a concentration of said first conductivity type impurity lower than that of said first diffusion layer,
   said second diffusion layer is located between said first diffusion layer and said first region, and
   said first region is located between said second diffusion layer and said channel region.

8. The device according to claim 1, wherein a current density in said first region is lower than that in said second region in a case of applying a voltage to said gate electrode.

9. The device according to claim 1, wherein a net concentration of said first conductivity type impurity in said first region is lower than that in said second region.

* * * * *